United States Patent [19]

Arneson

[11] 4,100,578
[45] Jul. 11, 1978

[54] AFT SUMMING CIRCUIT FOR VARACTOR-TYPE TUNING SYSTEMS

[75] Inventor: Blayne E. Arneson, Evergreen Park, Ill.

[73] Assignee: Admiral Corporation, Schaumburg, Ill.

[21] Appl. No.: 793,364

[22] Filed: May 3, 1977

[51] Int. Cl.² .................... H04N 5/50; H04B 1/16
[52] U.S. Cl. .................................. 358/191; 325/418; 325/465
[58] Field of Search ............... 358/191; 325/422, 423, 325/453, 456, 464, 465, 418, 462; 334/15, 16, 11

[56] References Cited

U.S. PATENT DOCUMENTS

| 3,750,028 | 7/1973 | Uchida | 325/464 |
|---|---|---|---|
| 3,906,372 | 9/1975 | Schatter | 325/464 |
| 3,968,437 | 7/1976 | Ong | 358/191 |

Primary Examiner—John C. Martin
Attorney, Agent, or Firm—R. Lewis Gable; Albert G. Marriott

[57] ABSTRACT

There is disclosed an AFT summing circuit for a varactor-type tuning system and in particular for such a tuning system including a UHF tuner and a VHF tuner. A tuning voltage derived from a suitable source indicative of the desired channel or station to be tuned is applied to one input of the AFT summing circuit, while an error signal as derived from an AFT circuit is applied to the other input, to be summed together in a manner whereby the effect of the AFT signal may be adjusted without affecting the tuning voltage. The AFT circuit output is applied at a first level when the VHF tuner is operative, and at a second attenuated level when the UHF tuner is operative. In particular, the AFT summing circuit includes first and second impedance elements for applying the AFT circuit output to first and second input terminals of an operational amplifier, and a third impedance element for applying the tuning voltage to the second input terminal. A fourth impedance element is connected in a feedback loop from the output of the operational amplifier to the first input terminal. The values of the first, second, third and fourth impedances $Z_1$, $Z_2$, $Z_3$ and $Z_4$ are selected to satisfy the following equation in order that a substantially predetermined gain is provided to the tuning voltage, regardless of the adjustments made to the AFT circuit output:

$$\frac{Z_1}{Z_4} = \frac{Z_3}{Z_2}$$

Further, there is included means for applying a variable control or gain to the correction signal component of the output of the operational amplifier.

16 Claims, 8 Drawing Figures

Fig. 1.

AFT SUMMING CIRCUIT FOR VARACTOR-TYPE TUNING SYSTEMS

CROSS-REFERENCE TO RELATED APPLICATION

Cross-reference is made to the copending application entitled, "Selectively Coupled Synthesizer for Tuner of TV Receiver", filed May 25, 1976 in the name of D. W. Rhee, U.S. Ser. No. 689,660 and assigned to the assignee of the subject invention; this application is hereby incorporated by reference.

BACKGROUND OF THE INVENTION

1. Field of the Invention

The present invention relates to varactor-type tuning systems for television receivers and in particular to a summing circuit therefor, for summing an AFT signal and a tuning voltage.

2. Description of the Prior Art

Varactor-type tuning circuits are well-known in the art and particularly have been adopted for tuning tuners including both UHF and VHF sections of a television receiver. Such tuning circuits incorporate a varactor diode whose capacitance is dependent upon a tuning voltage applied thereto. The amplitude of the tuning voltage is determined selectively to set the channel to which the tuner is to be tuned. Further, it is well-known in the art to affect or adjust the tuning voltage as applied to the varactor-type tuning system by adding thereto an AFC or AFT correction signal. Typically, an AFT correction signal is obtained from a frequency-sensing circuit within an IF amplifier of the television receiver. In turn, the AFT correction signal is applied to the local oscillator circuit of the varactor-type tuner and in particular to a voltage-dependent reactive element, whose characteristics are varied to change the output of the local oscillator. The sensed polarity of the correction voltage is such that if the IF frequency is not correct, the frequency of the local oscillator is adjusted in a direction to tend to minimize the error or correction voltage. In prior art tuning systems, the reactive element has been an active element or, as in varactor-type tuning systems, the reactive element takes the form of a semiconductor device having a reverse bias junction, the capacitance of which varies inversely with the amplitude of the applied voltage; these devices are known as "varactors".

The use of varactors complements the operation of an automatic fine-tuning (AFT) circuit, in that the AFT correction signal is added to the primary source of tuning voltage in a manner such that the AFT correction signal is switched on or off without disturbing or altering the primary tuning voltage. To this end, it is a common technique to "float" the frequency-sensing circuit of the IF amplifier, so that it may be connected in-series with the source of the primary tuning voltage. However, this is not possible in those tuning systems implemented with integrated circuitry in that the AFT circuit is disposed within the integrated circuit and must be referenced to a common ground. It has been suggested that where such circuits are implemented by semiconductor integrated techniques, the output of the AFT circuit be adapted to provide a differential output, i.e. a two-terminal output with a DC offset voltage common to both output terminals. The offset voltage may be canceled by injecting a DC voltage equal to the offset voltage.

Exemplary of the prior art AFT summing circuits is U.S. Pat. No. 3,878,466, which discloses that the output of its AFC or AFT circuit is amplified by a pair of transistors and applied to a resistive-type network in the form of a bridge, wherein a first input is an amplified AFT circuit output and is applied to a first terminal of the bridge network, while the tuning voltage is applied to a diagonally-opposed terminal of the bridge network, with the summed output taken from the other two terminals and applied, respectively, to the VHF and UHF tuners. Experience has shown that the use of employing a resistive network for coupling and summing the tuning voltage and the AFT correction signal is that the output of the AFC or AFT circuit cannot be disconnected or adjusted for the particular tuning range, i.e. VHF or UHF, that is being received by the television receiver. In this regard, the impedance of the resistive network must be high, in order that the presence or absence of the output of the AFT circuit will not affect the tuning voltage. However, if the impedance of the resistive network is selected to be high, the relative effect of the output of the AFT circuit becomes small. For example, if the tuning voltage varies in the range of 20–30V and a relatively high resistive network is used, the relative change for such tuning voltage becomes increasingly smaller, with correspondingly less effect upon the local oscillator.

Further, it is noted that a typical UHF varactor tuner is very sensitive to the presence of an AFC correction signal and it is desired that when the UHF varactor tuner is operative and the television receiver is receiving UHF signals, the output of the AFT circuit be attenuated. In this regard, prior AFT summing circuits have not satisfactorily accounted for either the attenuation or the disconnecting of the output of the AFT circuit, without unduly affecting the tuning voltage.

SUMMARY OF THE INVENTION

It is therefore an object of this invention to provide a new and improved AFT summing circuit for a varactor-type tuner, particularly adapted to be used with a television receiver having both a UHF and VHF varactor tuner.

It is a further object of this invention to provide an AFT summing circuit for summing an AFT correction signal and a tuning signal in a manner such that the effect of the AFT correction signal may be disconnected or varied without affecting the tuning voltage.

These and other objects of the invention are accomplished by providing an AFT summing circuit for summing the tuning voltage or signal derived from a tuning source, with a correction or output signal derived from an AFT circuit and applying the summed output to a varactor tuner. In particular, the AFT summing circuit comprises an operational amplifier having first and second inputs, and an output having an AFT correction component and a tuning component. The AFT summing circuit comprises first means associated with the operational amplifier for imparting a substantially predetermined gain to the tuning component, and further, a second means for varying the AFT signal component of the composite output.

In an illustrative embodiment of this invention, the first means of the AFT summing circuit takes the form of first and second impedance elements ($Z_{hd\,1}$, $Z_2$) connected, respectively, to the first and second inputs of the operational amplifier, a third impedance element ($Z_3$) connected to the second input, and a fourth impedance element ($Z_4$) connected between the output and the first input of the operational amplifier, wherein the relationship between the aforementioned impedances is defined by the following expression:

$$\frac{Z_1}{Z_4} = \frac{Z_3}{Z_2}$$

In a further feature of this invention, the second means comprises a fifth impedance element connected between the operational amplifier output and a summing circuit output, and a sixth impedance element connected between the circuit output and the third impedance element, wherein at last one of the fifth and sixth impedance elements is made variable to vary the effect of the AFT component.

In a still further aspect of this invention, the second means takes the form of a switch for defeating the application of the AFT correction signal to the first and second inputs of the operational amplifier.

In one illustrative embodiment of this invention, wherein the AFT summing circuit is used with a television receiver, including both a UHF and a VHF varactor tuner, means are provided to attenuate or reduce the effect of the AFT correction signal, when the UHF tuner is operative.

BRIEF DESCRIPTION OF THE DRAWINGS

These and other objects and advantages of the present invention will become more apparent by referring to the following detailed description and accompanying drawings, in which.

DETAILED DESCRIPTION OF THE PREFERRED EMBODIMENT

Figure 1:
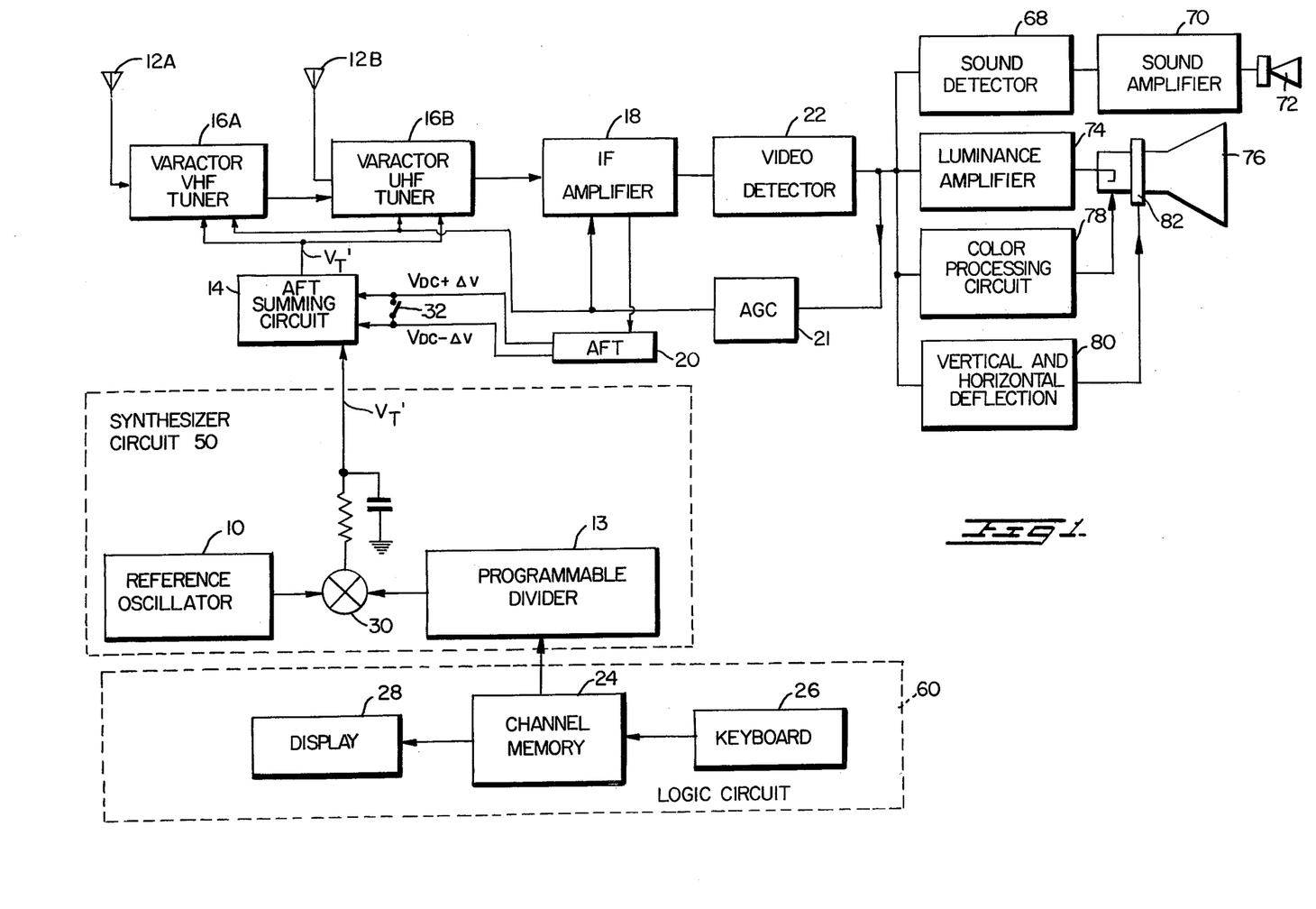
FIG. 1 is a schematic diagram of a television viewer including both VHF and UHF varactor-type tuners, and an AFT summing circuit in accordance with the teachings of this invention.

With reference to the drawings and in particular to FIG. 1, there is shown a color television receiver into which there has been included both UHF and VHF varactor tuners 16A and 16B, along with an AFT summing circuit 14 in accordance with the teachings of this invention. Attennae 12A and 12B are coupled, respectively, to the varactor-type VHF and UHF tuners 16A and 16B. An automatic fine-tuning circuit 20 provides and applies output signals in the form of ($V_{DC} + \Delta V$) and ($V_{DC} - \Delta V$). wherein $V_{DC}$ is a reference or offset signal and the value $\Delta V$ represents the error or correction value, to one pair of inputs of the AFT summing circuit 14. A third input is derived from a synthesizer circuit 50, which, as explained below, acts as a source of the tuning voltage $V_T$. In turn, the AFT summing circuit 14 applies a summed output signal to the local oscillator circuits (not shown) of both of the varactor UHF and VHF tuners 16A and 16B. The output of the varactor VHF tuner 16A is applied to the varactor UHF tuner 16B, and its output is applied via an IF amplifier 18 to a video detector 22. The video detector output is applied to a conventional automatic gain control (AGC) circuit 21, whose output is applied to the IF amplifier 18 and to the tuners 16A and 16B. The output of the video detector 22 is applied also to a luminance amplifier 74, the output of which controls a representation of monochrome or brightness information as applied to the cathode element of a cathode ray tube (CRT) 76. Further, the output of the video detector 22 also is applied to a vertical and horizontal deflection circuit 80 whereby suitable vertical and horizontal deflection signals are applied to a yoke 82 disposed about the envelope of a cathode ray tube 76. In addition, the video detector output is applied to a sound channel comprised of a sound detector 68 whose output is amplified by a sound amplifier 70 before being applied to a loudspeaker 72. Further, the output of the video detector 22 is applied to a color processing circuit 78, whereby the appropriate red, green and blue signals are developed and applied to the respective electron guns of the color cathode ray tube 76.

Further, the synthesizer circuit 50 includes a reference oscillator 10 for providing a substantially constant output signal of 4 MHz, to be applied via a programmable divider 13, whereby the oscillator output signal is divided by a fixed factor to be applied to a phase comparator or mixer 30. A further input is applied to the phase comparator 30 from a programmable divider 14, comprised, as will be explained in the above-referenced application of Rhee, of a plurality of dividers and a read-only memory (ROM), whereby the programmable divider 14 is selectively set to provide an input signal thereto by a factor dependent upon the selected TV channel to be tuned. The particular channel to be tuned is set by a logic circuit 60 comprised of a keyboard 26, upon which the viewer/operator selects the channel to be tuned, and whose output indicative of the channel to be tuned is applied to a channel memory 24. The memory 24 stores the selected channel, and applies its outputs to a display 28 whereby the selected channel is visually displayed and also to the programmable divider 13 to determine the factor by which the output of the local oscillator (not shown) within either of tuners 16A or 16B is divided selectively in accordance with the selected channel. The programmable divider output in turn in phase-compared with the divided reference oscillator output to provide the tuning signal $V_T$, typically a DC voltage signal, of an amplitude determined in accordance with the channel to be tuned by one of the tuners 16A or 16B. The detailed circuitry of the synthesizer circuit 50 and the logic circuit 60 is shown and described within the above-identified patent application of Rhee.

Figure 2:
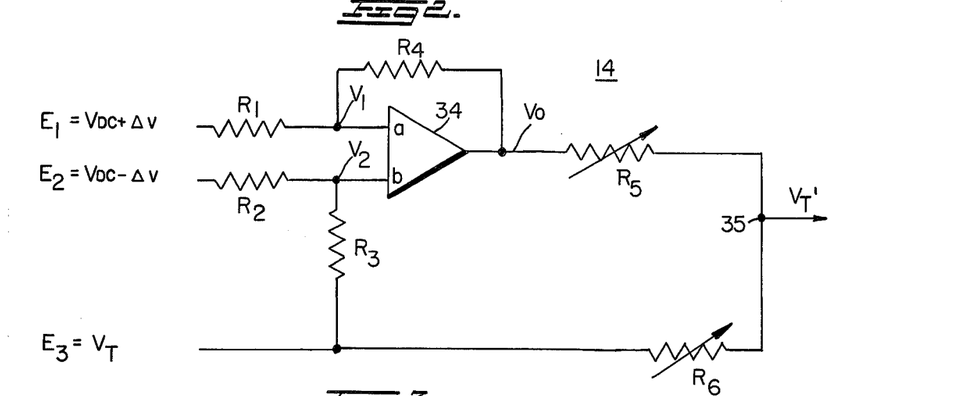
FIGS. 2, 3 and 4 disclose various embodiments of the AFT summing circuits in accordance with the teachings of this invention.

With reference now to FIG. 2, there is shown an illustrative embodiment of the AFT summing circuit 14 as as shown generally in FIG. 1. In particular, as indicated in both FIGS. 1 and 2, the AFT correction signal, taking the form of $V_{DC} + \Delta V$ and $V_{DC} - \Delta V$, is applied via impedance elements or resistors $R_1$ and $R_2$ to the first and second input terminals $a$ and $b$ of an operational amplifier 34, whereas the tuning voltage $V_T$ is applied via resistor $R_3$ to the second input terminal $b$ of the operational amplifier 34. As shown in FIG. 1, an AFT defeat switch is disposed between the outputs of the AFT circuit 20, and upon being closed, shorts out the AFT signal, preventing it from being applied to the AFT summing circuit 14. A fourth impedance element or resistor $R_4$ is connected in feedback loop from the output of the operation amplifier 34 to the first input terminal $a$. Further, a fifth impedance element or resistor $R_5$ is coupled from the output of the operational amplifier 34 to a summing point or output 35, whereat the summed output of the AFT summing circuit 14 is derived in terms of an output voltage $V_T'$. A sixth impedance element or resistor $R_6$ is coupled from the summing junction point 35 to the end of the third resistor $R_3$ remote from the second input terminal $b$.

The operatin of the AFT summing circuit 14 now will be analyzed by developing a series of equations, as will be set out below. In the following, $V_o$ indicates the output of the operational amplifier 34, whereas $E_1 = V_{DC} + \Delta V$, $E_2 = V_{DC} - \Delta V$, and $E_3 = V_T$. First the nodal equations for the voltages $V_1$ and $V_2$ as respectively appear at the first and second input terminals $a$ and $b$ of the operational amplifier 34, are developed as follows:

$$\frac{V_1}{R_1} + \frac{V_1}{R_4} - \frac{E_1}{R_1} - \frac{V_0}{R_4} = 0 \tag{1}$$

or $$V_0 = V_1 R_4 \left(\frac{R_4 + R_1}{R_4 R_1}\right) - E_1\left(\frac{R_4}{R_1}\right)$$

and $$\frac{V_2}{R_2} + \frac{V_2}{R_3} - \frac{E_2}{R_2} - \frac{E_3}{R_3} = 0 \tag{2}$$

or $$V_2 = \left(\frac{E_2}{R_2} + \frac{E_3}{R_3}\right)\left(\frac{R_2 R_3}{R_2 + R_3}\right)$$

For closed-loop operation of the AFT summing circuit 14 with tight feedback, the voltage $E_1$ is substantially equal to voltage $E_2$. Now, by substituting equation (2) into equation (1) and letting $E_2 = E_1$, there is provided the following equation for the output $V_o$ of the operational amplifier 34:

$$V_0 = \left(\frac{E_2}{R_2} + \frac{E_3}{R_3}\right)\left(\frac{R_2 R_3}{R_2 + R_3}\right) R_4\left(\frac{R_4 + R_1}{R_4 R_1}\right) - E_1\left(\frac{R_4}{R_1}\right) \tag{3}$$

If in the AFT summing circuit 14, the resistances $R_1$, $R_2$, $R_3$ and $R_4$ are made equal, the output voltage $V_o$ may be expressed by the following equation:

$$V_o = E_2 + E_3 - E_1 \tag{4}$$

Considering now the complete AFT summing circuit 14 as shown in FIG. 2 and substituting $V_{DC} + \Delta V$ and $V_{DC} - \Delta V$ for $E_1$ and $E_2$, respectively, the output of the operational amplifier 34 may be expressed by the following equation:

$$V_o = (V_{DC} + \Delta V) + (V_T) - (V_{DC} - \Delta V) = V_T + 2\Delta V \tag{5}$$

Now, summing the output voltage $V_o$ as derived from equation (5) with the tuning voltage $V_T$ in the output resistors $R_5$ and $R_6$, provides the following set of equations:

$$\frac{V_{T'}}{R_5} + \frac{V_{T'}}{R_6} - \frac{V_0}{R_5} - \frac{V_T}{R_6} = 0 \tag{6}$$

$$V_{T'}\left(\frac{R_5 + R_6}{R_5 R_6}\right) = \frac{V_0 R_6 + V_T R_5}{R_5 R_6} \tag{7}$$

$$V_{T'} = \frac{V_0 R_6 - V_T R_5}{R_5 + R_6} \tag{8}$$

Noting that $V_o = V_T + 2\Delta V V_{T'}$ may now be expressed by the following set of equations:

$$V_{T'} = \frac{V_T R_6 + 2\Delta V R_6 + V_T R_5}{R_5 + R_6} \tag{9}$$

$$V_{T'} = V_T + 2\Delta V \frac{R_6}{R_5 + R_6} \tag{10}$$

By observing equation (10), it is noted that the output voltage $V_{T'}$ of the AFT summing circuit 14 is dependent upon the value of the input tuning voltage $V_T$, but that the tuning voltage $V_T$ is not modified or affected by the relative values of the impedances $R_5$ and $R_6$. However, the error voltage as expressed by $2\Delta V_{DC}$ may be adjusted by the values of the resistances $R_5$ and $R_6$. Thus, as applied particularly to the AFT summing circuit 14, it is apparent that the contribution of the AFT circuit 20 may be modified or eliminated by the adjustment of one or both of the impedance $R_5$ and $R_6$. The particular significance of this observation is realized when it is noted that the slopes of the tuning voltage-versus-frequency of the varactor VHF and UHF tuners 16A and 16B do differ, and that the sensitivity and in particular the slope of the UHF tuner 16B is significantly greater than that of the VHF tuner 16A. Thus, in operation, it is desired to so adjust one or both of the variable impedances $R_5$ and $R_6$ to attenuate the effect of the correction factor $\Delta V$ as derived from the AFT circuit 20, i. e. the AFT correction component of the circuit output signal $V_{T'}$. In this manner, the UHF tuner 16B is operated with stability in response to the AFT circuit output, due to the attenuation imparted by the AFT summing circuit 20.

Figure 3:
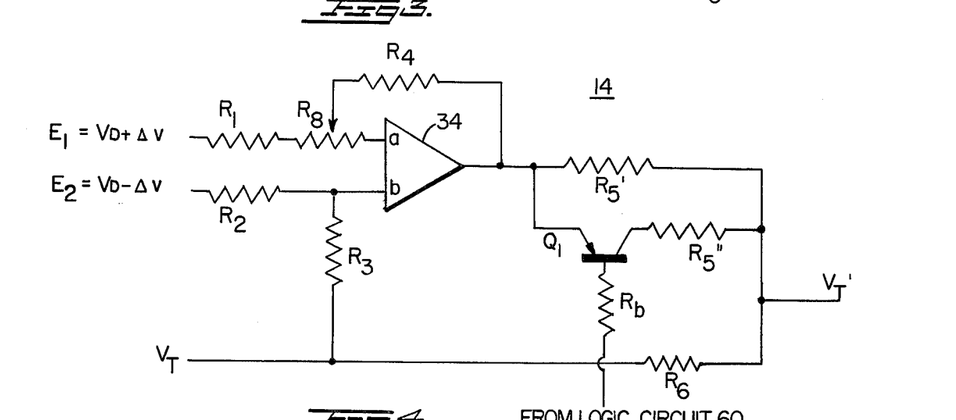

With reference now to FIG. 3, there is shown an alternative embodiment of the AFT summing circuit 14 as shown in FIG. 2, wherein there is shown the manner in which one of the resistances $R_5$ or $R_6$ may be adjusted. It is noted that elements similarly marked in FIG. 2 are so marked in FIG. 3 and in the remaining figures. the value of the first output resistance is modified by the following arrangement, wherein a resistance $R_5'$ may be connected selectively in-parallel with a second resistance $R_5''$ by rendering the switching transistor $Q_1$ conductive. In particular, an appropriate actuating signal is derived from the logic circuit 60 and applied via a biasing resistor $R_b$ to the base of transistor $Q_1$, thereby rendering it conductive to connect resistors $R_5'$ and $R_5''$ in-parallel with each other, thereby lowering the impedance presented thereby to the output of the operational amplifier 34. Thus, the value of the impedance $R_5$ as it appears in equation (10) is reduced, thus increasing the AFC voltage contribution. It is contemplated that when the varactor VHF tuner 16A is operated, a suitable actuating signal is applied from the logic circuit 60 to render transistor $Q_1$ conductive and to reduce the value of the impedance $R_5$ whereby V AFT correction component $\Delta$ of the AFT output signal $V_T'$ is incrased. When the television receiver as shown in FIG. 1 is operted so that its UHF tuner 16B is operative, the transistor $Q_1$ is rendered non-conductive, thus presenting a higher impedance $R_5'$ and decreasing the effect of the AFC component $\Delta V$.

In developing equation (3), above, it was assumed that all of the resistors $R_1$, $R_2$, $R_3$ and $R_4$ were equal. This is not a necessary requirement for the operation of the AFT summing circuit 14. However, it is a condition for operating the AFT summing circuit 14 that the component of the operational amplifier output $V_o$ due to the tuning voltage as applied via the input $E_3$, remain constant. In other words, it is not desired that any change be made to the tuning voltage $V_T$ component as a result of an adjustment for the correction voltage as derived from the AFT circuit 20. Referring to equation (3) as expressed above, the tuning voltage contribution may be expressed as $$V_{Tout} = \frac{E_3}{R_3} \frac{(R_2 R_3)}{R_2 + R_3} \cdot \frac{R_4 + R_1}{R_1} \qquad (11)$$

From an examination of equation (11), it is seen that a unity gain of the tuning voltage component $V_T$ is assured if the conditions of the following equation are met:

$$\frac{R_2 R_3}{R_1 R_3} \cdot \frac{R_4 + R_1}{R_2 + R_3} 32\ 1 \qquad (12)$$

To simplify equation (12), let $(R_4/R_1) = A$ and $(R_2/R_3) = B$, and substituting these expression into equation (12) provides:

$$\frac{R_2}{R_1} \cdot \frac{AR_1 + R_1}{R_2 + BR_2} = 1 \qquad (13)$$

From equation (13), it is seen that the condition for unity gain of the tuning voltage component $V_T$ is met if $(A + 1/B + 1) = 1$, which is met if $A = B$, i. e. $(R_4/R_1) = (R_3/R_2)$. It is not necessary to operate the summing circuit with a unitary gain, but with a substantially constant or predetermined gain which is ensured if the conditions of the following equation are met:

$$\frac{R_4}{R_1} = K \frac{R_3}{R_4}, \qquad (13A)$$

where K is constant, and the values of the resistors $R_1$, $R_2$, $R_3$ and $R_4$ are selected to satisfy equation (13A), ensuring a constant gain to the tuning component. Now, with regard to equation (3), the output term due to the input signal $E_2$ may be expressed as follows:

$$E_{2out} = E_2 \frac{B(A + 1)}{[B + 1]} \qquad (14)$$

However, as indicated above, A = B, so that equation (14) may be simplified as:

$$E_{2out} = BE_2 \qquad (15)$$

Similarly, an expression for the output component of $V_o$ due to the $E_1$ input signal may be derived from equation (3) as follows:

$$E_{1out} = -E_1 \frac{R_4}{R_1}$$
$$= E_1 A$$

Since $A = B$, it is evident that the magnitude of the $E_2$ output component of the operational amplifier 34 is equal to the magnitude of the $E_1$ output terminal.

Figure 4:
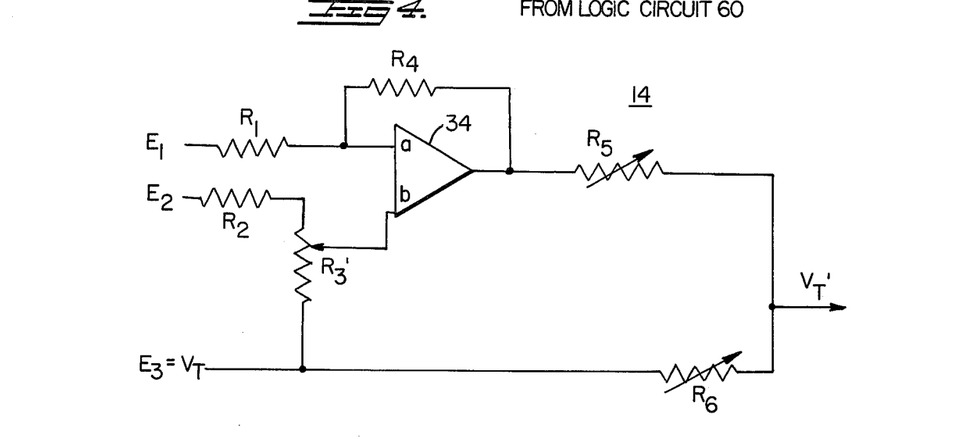

In considering the summing circuit 14 as shown in any of FIGS. 2, 3 and 4, it is necessary that in order to meet the condition that $$\frac{R_4}{R_1} = K \frac{R_3}{R_2}$$

to achieve a predetermined gain of the tuning voltage $V_T$ component, some compensation must be made for tolerances of the resistances $R_1$, $R_2$, $R_3$ and $R_4$. Typically, resistors as are incorporated into this circuit, have a 5% tolerance and as a result, an adjustment range of some ±11% is required to achieve the desired characteristics of the summing circuit 14. To this end, a variable resistor $R_8$ is incorporated into the AFT summing circuit of FIG. 3, and a variable resistor $R_3'$ into the AFT summing circuit of FIG. 4, whereby appropriate adjustment may be made for tolerances of the resistors. In an illustrative technique for setting either of the AFT circuits of FIGS. 3 or 4, the operational amplifier 34 is first disconnected from the tuners 16A and 16B and is connected to a previously aligned tuning voltage source set to a middle UHF channel frequency, e. g. 48 or 49. Next, the adjusted, tuning voltage source is connected to the $E_3$ input terminal, and the $E_1$ and $E_2$ input terminals are connected to ground through resistances equal to the internal impedance of the AFT circuit 20. Next, the output of the operational amplifier 34 is connected to the input terminals of the tuners 16A and 16B and either the resistor $R_8$ or $R_3'$ is adjusted until the selected channel is again properly tuned. The reason for using a UHF channel in such a set-up process is that the offset current error of the operational amplifier will be canceled out during the initial set-up. When so balanced, the tuning voltage $V_T$ component is exactly equal to $V_T'$, i.e. a unity gain of the tuning voltage $V_T$ may be obtained, and the AFT correction voltage component ranges illustratively from 0.9 to 1.11 times the output of the AFT circuit 20. This varying output demands upon the setting of the variable resistor $R_8$ or $R_3'$, as shown respectively in FIGS. 3 and 4.

As explained above, it is contemplated that the AFT circuit 20, as shown in FIG. 1, may be constructed using large-scale integrated techniques, which typically are referenced to a common ground potential. Thus, the outputs of such integrated circuits are differential, i.e. a two-terminal output with a DC offset potential, to each output, as shown in FIG. 1. In particular, the offset voltage $V_{DC}$ is common to each of the outputs of the AFT circuit 20, with the AFT correction component $\Delta$ being subtracted from the first output line and added to the second output line from the AFT circuit 20. With such an input arrangement, the offset voltage $V_{DC}$ is automatically canceled.

Figure 5:
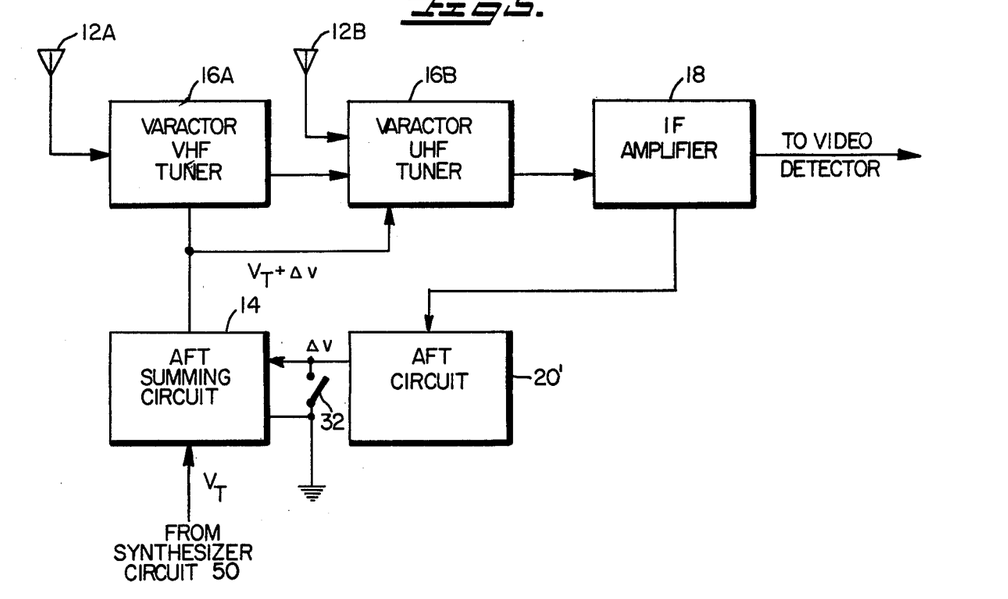
FIGS. 5 and 6 show portions of the television receiver as shown in FIG. 1, illustrating different types of interconnections between the AFT circuit and the AFT summing circuit of this invention.
Figure 6:
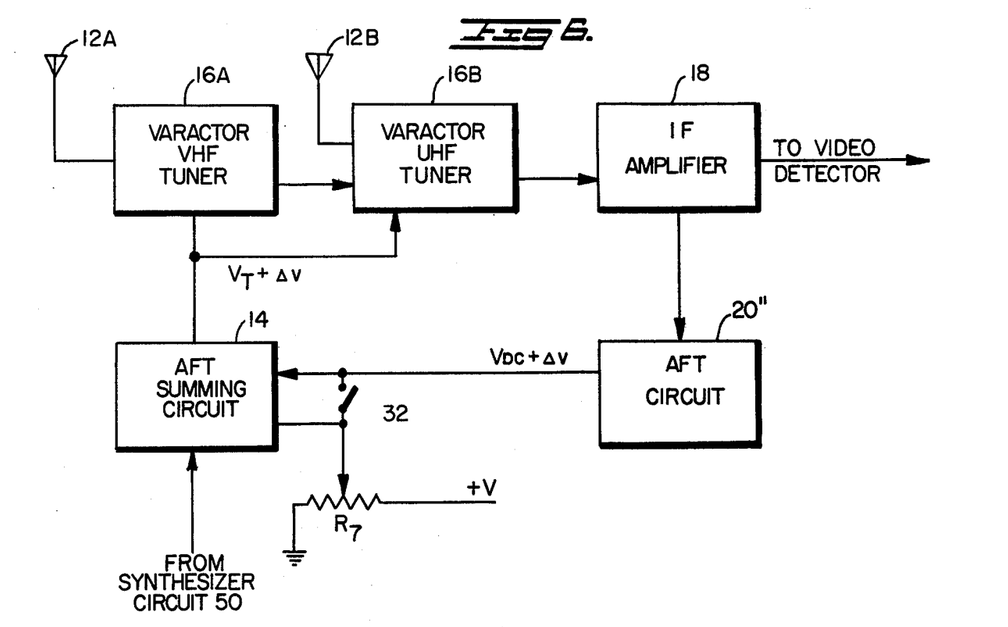

With reference now to FIG. 5, there is shown an AFT circuit 20' with a single-ended AFT output with no DC offset component, i.e. the AFT correction component Δ is applied between two input terminals of the AFT summing circuit 14, one of which is connected directly to ground. In FIG. 6, there is shown an AFT circuit 20" having a single AFT component with a DC offset, as adjustably provided by a variable resistive element $R_7$, i.e. the value of the offset voltage $V_{DC}$ is established by the position of the tap of the resistive element $R_7$ which is connected between a biasing source $+V$ and ground. In such a circuit arrangement, the offset component $V_{DC}$ is canceled by injecting a DC voltage component equal to the offset $F_{DC}$.

Figure 7:
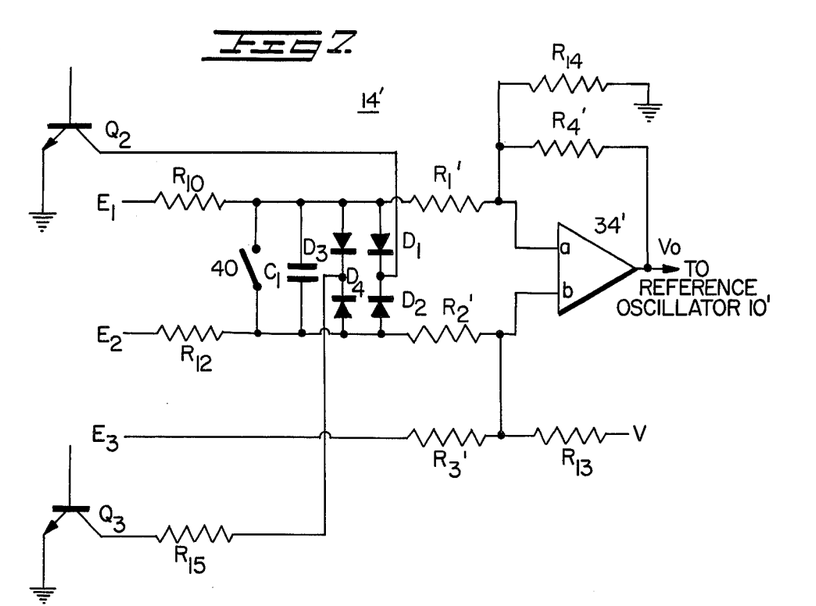
FIG. 7 shows a further embodiment of an AFT summing circuit in accordance with the teachings of this invention.

With regard to FIG. 7, there is shown a further embodiment of this invention in which the AFT correction signal is applied via the $E_1$ and $E_2$ inputs via resistors $R_1'$ and $R_2'$ to the first and second inputs $a$ and $b$ of an operational amplifier 34'. The elements as described in the circuit of FIG. 7 are generally similar to those previously described and similar elements are given a primed reference character similar to that previously assigned. A tuning voltage is applied via terminal $E_3$, and resistor $R_3'$ to the second input terminal b of the operation amplifier 34, while a feedback resistor $R_4'$ is interconnected between the output and the first input terminal a of the operational amplifier 34'. As will be explained in detail later, an output voltage $V_o$ is applied to a reference oscillator 10', as more clearly shown in FIG. 8. Generally, as explained above, the operational amplifier 34' provides an output $V_o$, whose tuning voltage component is unaffected by the presence or absence of the AFT correction component as applied to the input terminals $E_1$ and $E_2$.

Figure 8:
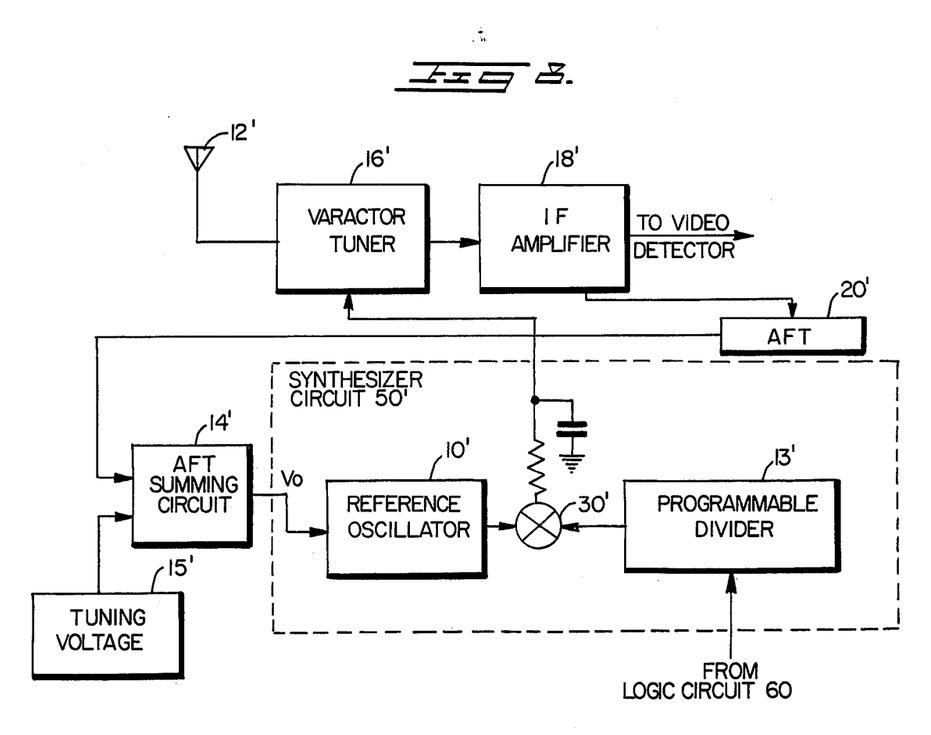
FIG. 8 shows, in diagrammatic form, a television receiver wherein the AFT summing circuit output is coupled to a reference oscillator of a synthesizer circuit.

A pair of oppositely-poled diodes $D_1$ and $D_2$ is connected in-series between those terminals remote from the operational amplifier 34' of the resistive elements $R_1'$ and $R_2'$. Further, the point of interconnection between the diodes $D_1$ and $D_2$, is connected selectively via a switch in the form of a transistor Q2 to a ground. Basically, the transistor Q2 serves as an AFT defeat switch, whereby the midpoint between diodes $E_1$ and $D_2$ is connected to ground to defeat the input of the AFT signal while a channel selection operation is occuring, to avoid the bucking of the AFT correction signal and the tuning voltage to capture or to set the tuning frequency of the connected varactor-type tuner. If the AFT correction signal were not otherwise defeated, the varactor tuner 16' as shown in FIG. 8 would be unable to lock or to capture the desired selected channel. In an illustrative embodiment of this invention, the control signal applied to the base of transistor Q2 is derived from the synthesizer circuit 50' as shown in FIG. 8, for a discrete period of time, e.g. 0.25 sec., during the tuning operation of the synthesizer circuit 50'. Further, a second pair of diodes $D_3$ and $D_4$ may be connected across the oppositely-poled capacitor $C_1$, with their point of interconnection connected via a resistor $R_{15}$ to the collector of a transistor $Q_3$. When an enabling signal as derived from the logic circuit 60 is applied to the base of the transistor $Q_3$, the point of interconnection between the diodes $D_3$ and $D_4$ is connected by resistor $R_{15}$ to ground, thus attenuating, though not entirely defeating, the effect of the AFT correction signal.

Further, resistive elements $R_{10}$ and $R_{12}$ are disposed, respectively, in the paths between the input $E_1$ and the input terminal $a$, and the input $E_2$ and the input terminal b of the operational amplifier 34'. Further, a capacitor $C_1$ is interconnected between the point of interconnection between the resistor $R_{10}$ and the diode $D_1$, and the point of interconnection between resistor $R_{12}$ and diode $D_2$. The circuit comprised of resistors $R_{10}$ and $R_{12}$ and capacitor $C_1$ is an integrating or filtering network to removed undesired high-frequency signals. Further, a switch 40 is interconnected between the input terminals $E_1$ and $E_2$ as an AFT defeat switch. In an illustrative embodiment of this invention, switch 40 may be coupled mechanically to a fine-tuning control, whereby the switch 40 is closed during an actuation of the fine-tuning control. The diodes $D_1$ and $D_2$ provide a means of disabling the AFT correction signal when it is not desired, by effectively grounding the junction of their cathodes, thereby shorting both AFT lines to ground.

In the particular embodiment shown in FIG. 7, the AFT correction signals applied to the input terminals $E_1$ and $E_2$ each has a bias above ground, i.e. the lowest voltage that would be applied to the input terminals $a$ and $b$ of the operational amplifier 34' is above ground whereby when the point of interconnection between the diodes $D_1$ and $D_2$ is connected to ground, the diodes $D_1$ and $D_2$ both are rendered forwardly conductive to effectively switch and to connect the input terminals $a$ and $b$ to ground.

A resistor $R_{14}$ is connected between the point of interconnection between resistor $R_4'$ and the input of the operational amplifier 34' to provide a balance between the source impedance presented to the input terminals $a$ and $b$ of the operational amplifier 34'. Further, a resistor $R_{13}$ is interconnected to the input terminal b and a substantially constant potential source V to provide a predetermined offset component to the output signal $V_o$ under those conditions when the AFT correction signal is defeated as explained above. Typically, the voltage source V provides, in a sense, a reference voltage to offset the output tuning voltage $V_o$ with respect to the input tuning voltage $V_T$ as may be required in this specific application.

With reference now to FIG. 8, there is shown a further embodiment of a television system into which the AFT summing circuit 14' as described in FIG. 7, may be incorporated. Many of the circuits as shown in FIG. 8 are similar to those as described with regard to FIG. 1, similar elements being identified with primed characters similar to those in FIG. 1. The AFT summing circuit 14' as described with respect to FIG. 7 is particularly adapted to apply its output voltage $V_o$ directly to a reference oscillator 10' of the synthesizer circuit 50', which in turn applies its output to a phase comparator 30' to be compared with the output of a programmable divider 13'. As described above, the output of the programmable divider 13' is of a frequency indicative of the desired channel to be tuned. A heterodyning function is performed by the phase comparator 30' with its output being applied to set the frequency to which the varactor tuner 16' is tuned. In turn, the output of the AFT circuit 20' is coupled to a first input of the AFT summing circuit 14', i.e. input terminals $E_1$ and $E_2$ as shown in FIG. 7. A distinct tuning voltage is developed by tuning voltage source 15', and is applied to the second input terminal, i.e. input terminal $E_3$ as shown in FIG. 7. In contrast to the embodiment shown in FIG. 1, wherein the tuning voltage was applied to the local oscillators of the VHF and UHF tuners 16A and 16B, the embodiment of FIG. 8 applies a variable voltage from the circuit 15' to the reference oscillator 10', wherein the television receiver as depicted in FIG. 8 is used to tune television signals transmitted over a cable system, e.g.

those channels within the middle and upper bands thereof or any case where the actual channel frequency differs from EIA standards. In turn, the output $V_o$ is applied to a varactor element within the reference oscillator $10'$ to set its output frequency.

Numerous changes may be made in the above-described apparatus and the different embodiments of the invention may be made without departing from the spirit thereof; therefore, it is intended that all matter contained in the foregoing description and in the accompanying drawings shall be interpreted as illustrative and not in a limiting sense.

What is claimed is:

1. In a receiver having tuner means for selectively detecting and processing a transmitted signal, an AFT circuit for providing a correction signal, and channel selection means for providing a tuning signal whose amplitude is indicative of the channel to be tuned by said tuning means, an AFT summing circuit comprising: amplifier means having first and second inputs for receiving, respectively, the correction signal and the tuning signal, for providing a composite output signal, to be applied to said tuning means and having a tuning signal component and a correction component, said amplifier means including first means for providing a substantially predetermined gain to the tuning signal component, and second means for varying the correction signal component of the composite output signal.

2. The AFT summing circuit as claimed in claim 1, wherein said amplifier means comprises an operational amplifier having first and second input terminals and an output terminal, first and second impedance elements for connecting the correction signal to said first and second input terminals, said first and second impedance elements having, respectively, impedances $Z_1$ and $Z_2$, a third impedance element for connecting the tuning voltage to said second impedance element and having an impedance $Z_3$, and a fourth impedance element connected in a feedback group from said output terminal to said first input terminal and having an impedance $Z_4$ wherein the impedances of the aforementioned impedance elements meet the following equation:

$$\frac{Z_1}{Z_4} = K\frac{Z_3}{Z_2},$$

where K is a constant.

3. The AFT summing circuit as claimed in claim 2, wherein there is included a circuit output from which the composite output signal is derived, a fifth impedance element connected between said output terminal of said operational amplifier and the circuit output, and a sixth impedance element connected in feedback from the composite output to the terminal of said third impedance element remote from said second input terminal of said operational amplifier, and at least one of said fifth and sixth impedance elements is variable to vary the amplitude of the correction signal component within the composite output signal.

4. The AFT summing circuit as claimed in claim 1, wherein said second means comprises switch means coupled to at least one of said first and second inputs for effectively disabling the input of the corrective signal to said amplifier means.

5. The AFT summing circuit as claimed in claim 2, wherein there is included a summing circuit output, and said second means comprises a fifth impedance element connected between said output terminal of said operational amplifier and said summing circuit output, and a sixth impedance element connected in a circuit to said second input, and at least one of said fifth and sixth impedance elements is adjustable to vary the amplitude of the correction signal component within the composite output signal.

6. In a television receiver having first and second tuner means for selectively detecting and processing transmitted signals within different frequency ranges, an AFT circuit for providing a correction signal for adjusting the tuning of said first and second tuner means, and channel selection means for providing a tuning signal whose amplitude is indicative of the channel to be tuned by one of said first and second tuner means, an AFT summing circuit comprising: amplifier means having first and second inputs for receiving, respectively, the correction signal and the tuning signal, for providing a composite output signal having a tuning signal component and a correction signal component, said amplifier means including first means for providing a substantially predetermined gain to the tuning signal component and second means for varying the correction signal component of the composite output signal.

7. The AFT summing circuit as claimed in claim 6, wherein said first means comprises an operational amplifier having a first input terminal, a second input terminal, and an output terminal, a first and second impedance elements having impedances $Z_1$ and $Z_2$ for connecting the correction signal to said first and second input terminals, a third impedance element having an impedance $Z_3$ for connecting the tuning signal to said second input terminal, and a fourth impedance element having an impedance $Z_4$ connected in feedback from said output terminal to said first input terminal.

8. The AFT summing circuit as claimed in claim 7, wherein the relationship between the impedances of the first, second, third and fourth impedance elements is provided by the following:

$$\frac{Z_4}{Z_1} = K\frac{Z_3}{Z_2},$$

where K is a constant.

9. The AFT summing circuit as claimed in claim 7, wherein said second means comprises fifth and sixth impedance elements having impedances, respectively, of $Z_5$ and $Z_6$, wherein at least one of said fifth and sixth impedance elements is variable to effect a variation of the correction signal component.

10. The AFT summing circuit as claimed in claim 9, wherein said first tuner means processes transmitted signals in the UHF range and said second tuner means processes transmitted signals in the VHF tuning range.

11. The AFT summing circuit as claimed in claim 10, wherein there is provided control means operative in a first mode wherein said VHF tuner means is operative and said one variable impedance element is set to provide a relatively high amplitude to the correction signal component and disposable in a second mode of operation wherein the UHF tuning means is made operative and said variable one impedance element is set to provide a lower amplitude to the correction signal component.

12. The AFT summing circuit as claimed in claim 11, wherein said control means comprises a seventh impedance element and a switch means operative in the second mode to interconnect and said seventh impedance element in-parallel with said fifth impedance element.

13. The AFT summing circuit as claimed in claim 7, wherein there is included an eighth variable impedance element coupled between said first impedance element and said first input terminal, and said fourth impedance element is connected to a variable tap thereof.

14. The AFT summing circuit as claimed in claim 13, wherein said third impedance element is a variable impedance element and said second input terminal of said operational amplifier is connected to the variable tap thereof.

15. In a television receiver having tuner means for selectively detecting and processing a transmitted signal, an AFT circuit for providing a correction signal, means for setting a channel to be tuned by said tuner means, variable divider means responsive to the output of said setting means for providing an output in accordance with a factor corresponding to the channel selected by said setting means, reference oscillator means for providing a reference frequency signal which may be adjusted, and means for comparing the output of said reference oscillator means with the output of said variable divider means for applying a tuning signal to said tuner means, an AFT summing circuit comprising:
   amplifier means having first and second inputs for receiving, respectively, the correction signal and the tuning signal, for providing a composite output signal to said reference oscillator and having a tuning signal component and a correction component, said amplifier means including first means for providing a substantially predetermined gain to the tuning signal component, and second means for varying the correction signal component of the composite output signal.

16. The AFT summing circuit as claimed in claim 15, wherein there is included first and second diode means coupled in opposing serial relationship, between the first and second inputs and a switch means for selectively connecting the point of interconnection between said first and second diodes to ground, whereby the application of the correction signal to said amplifier means is defeated.

* * * * *

UNITED STATES PATENT AND TRADEMARK OFFICE
CERTIFICATE OF CORRECTION

PATENT NO. : 4,100,578
DATED : July 11, 1978
INVENTOR(S) : Blayne E. Arneson

It is certified that error appears in the above-identified patent and that said Letters Patent are hereby corrected as shown below:

Claim 4, column 11, line 63, change "corrective" to --correction--.

Claim 7, column 12, line 29, before "first", delete "a".

Claim 12, column 13, line 1, delete "and".

Signed and Sealed this

Twenty-second Day of May 1979

[SEAL]

Attest:

RUTH C. MASON
Attesting Officer

DONALD W. BANNER
Commissioner of Patents and Trademarks